(12) United States Patent
Tadokoro

(10) Patent No.: US 11,348,642 B2
(45) Date of Patent: May 31, 2022

(54) MEMORY SYSTEM AND CONTROL METHOD THEREOF

(71) Applicant: Kioxia Corporation, Tokyo (JP)

(72) Inventor: Mitsunori Tadokoro, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/128,369

(22) Filed: Dec. 21, 2020

(65) Prior Publication Data

US 2022/0028456 A1    Jan. 27, 2022

(30) Foreign Application Priority Data

Jul. 27, 2020    (JP) .............................. JP2020-126616

(51) Int. Cl.

| | |
|---|---|
| *G11C 8/08* | (2006.01) |
| *G11C 16/08* | (2006.01) |
| *G11C 16/04* | (2006.01) |
| *G11C 16/26* | (2006.01) |
| *G11C 16/16* | (2006.01) |
| *G11C 16/10* | (2006.01) |

(52) U.S. Cl.
CPC .......... *G11C 16/08* (2013.01); *G11C 16/0483* (2013.01); *G11C 16/10* (2013.01); *G11C 16/16* (2013.01); *G11C 16/26* (2013.01)

(58) Field of Classification Search
USPC ...................................................... 365/185.23
See application file for complete search history.

(56) References Cited

U.S. PATENT DOCUMENTS

| | | | |
|---|---|---|---|
| 9,026,893 | B1 | 5/2015 | Syu et al. |
| 10,110,255 | B2 | 10/2018 | Yang et al. |
| 10,127,997 | B2 | 11/2018 | Baek et al. |
| 2019/0173492 | A1 | 6/2019 | Yang et al. |
| 2020/0335146 | A1* | 10/2020 | Alrod ................. G11C 16/0483 |

* cited by examiner

*Primary Examiner* — Jason Lappas
(74) *Attorney, Agent, or Firm* — Oblon, McClelland, Maier & Neustadt, L.L.P.

(57) ABSTRACT

A memory system has a non-volatile memory having a plurality of memory cells, and a controller configured to control writing, reading, and erasing of data into and from the non-volatile memory. The non-volatile memory includes a page for which the data is written and read to and from at least a part of the plurality of memory cells, and a block having a plurality of the pages. The controller manages a first block group including a plurality of the blocks and a second block group including a plurality of the first block groups, and generates a first parity for correcting an error occurring in the second block group by data in each of the plurality of first block groups in the second block group, and a second parity for correcting an error occurring in the first block group by data in the first block group.

20 Claims, 8 Drawing Sheets

MEMORY SYSTEM AND CONTROL METHOD THEREOF

CROSS REFERENCE TO RELATED APPLICATIONS

This application is based upon and claims the benefit of priority from the prior Japanese Patent Application No. 2020-126616, filed on Jul. 27, 2020, the entire contents of which are incorporated herein by reference.

FIELD

An embodiment of the present invention relates to a memory system and a control method.

BACKGROUND

In a memory system such as a solid state drive (SSD) using a NAND flash memory, reading and writing are performed for each page, and erasing is performed for each block having a size larger than that of the page. In the memory system, a process called garbage collection is performed in order to effectively use a storage area of the NAND flash memory. The garbage collection includes an operation of copying valid data stored in a plurality of blocks into a smaller number of one or more blocks in a free state. The garbage collection is often performed for the plurality of blocks. The garbage collection is sometimes referred to as compaction.

However, in order to copy the valid data in the plurality of blocks as garbage collection targets, a storage area having about the same size as the plurality of target blocks in a free state is required in the NAND flash memory. For the garbage collection, the storage area of the NAND flash memory may not be available for user data.

BRIEF DESCRIPTION OF THE DRAWINGS

FIG. 5 is a diagram illustrating arrangement locations of parities in a super block according to the present embodiment.

DETAILED DESCRIPTION

According to a memory system has:
a non-volatile memory having a plurality of memory cells; and
a controller configured to control writing, reading, and erasing of data to and from the non-volatile memory,
wherein the non-volatile memory includes
a page for which the data is written into and read from at least a part of the plurality of memory cells, and
a block having a plurality of the pages,
the controller is configured to
manage a first block group including a plurality of the blocks and a second block group including a plurality of the first block groups, and
generate a first parity and a second parity, the first parity being a parity for correcting an error occurring in the second block group by data in each of the plurality of first block groups in the second block group, and the second parity being a parity for correcting an error occurring in the first block group by data in the first block group.

Hereinafter, an embodiment of a memory system will be described with reference to the drawings. Hereinafter, components of the memory system will be mainly described, but the memory system may have components and functions not illustrated or described. The following description does not exclude the components and functions not illustrated or described.

Figure 1:
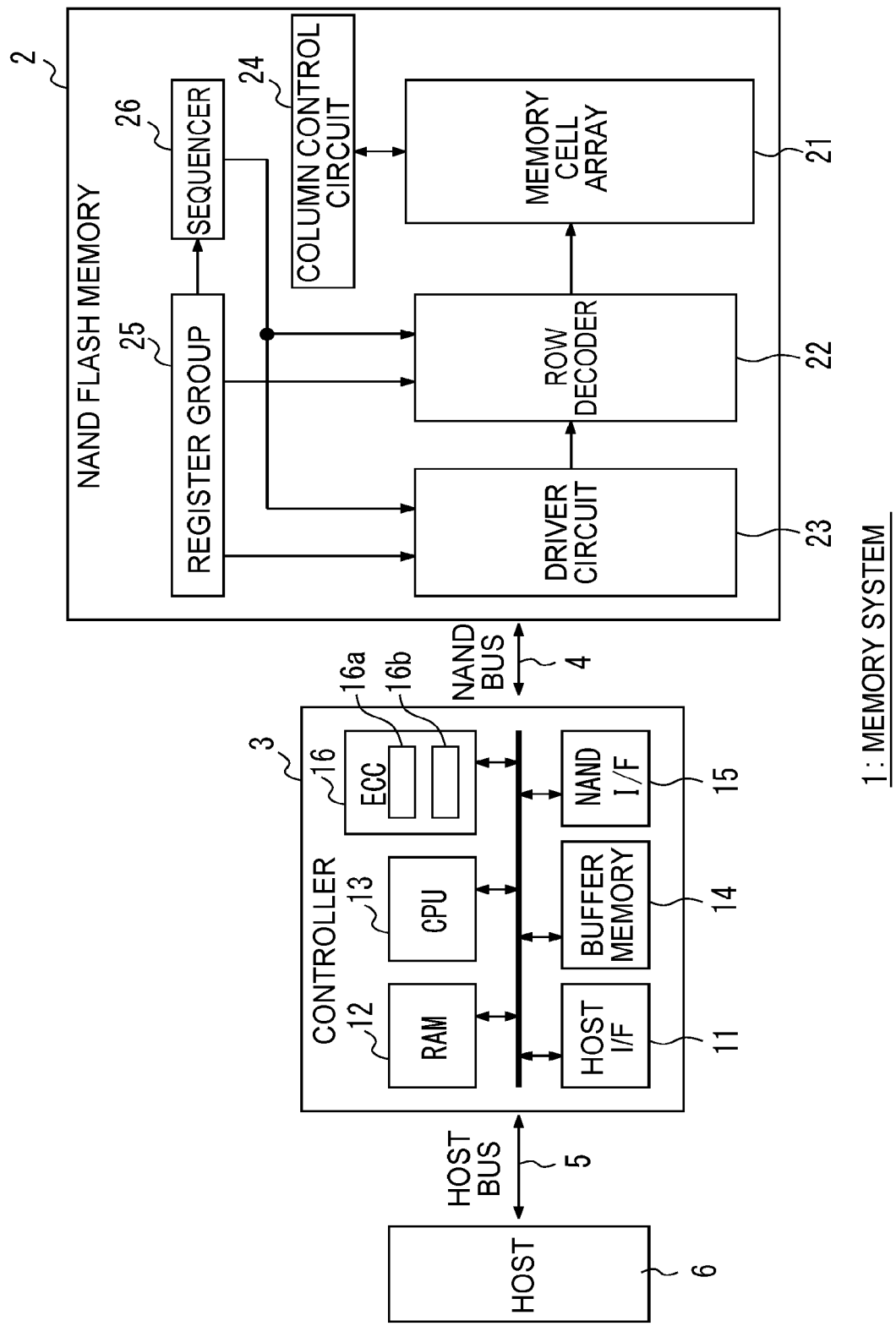
FIG. 1 is a block diagram illustrating a schematic configuration of a memory system according to an embodiment.

FIG. 1 is a block diagram illustrating a schematic configuration of a memory system 1 according to an embodiment. The memory system 1 of FIG. 1 illustrates a configuration of an SSD using a NAND flash memory (hereinafter, simply referred to as a NAND memory) 2. The memory system 1 of FIG. 1 can also be applied to various systems other than the SSD, for example, an SD card, a Universal Serial Bus (USB) memory, a Universal Flash Storage (UFS) device, a Multi Media Card (MMC), and the like.

The memory system 1 of FIG. 1 includes the NAND memory 2 and a controller 3. A specific configuration of the NAND memory 2 will be described later.

The controller 3 is connected to the NAND memory 2 by a NAND bus 4 and controls the NAND memory 2. The controller 3 can be connected to a host device 6 by a host bus 5. The controller 3 accesses the NAND memory 2 via the NAND bus 4 in response to an instruction received from the host device 6 via the host bus 5. The host device 6 is an electronic device such as a personal computer or a server. The host bus 5 is a bus that complies with interface standards such as PCIe (registered trademark), UFS, and Ethernet (registered trademark). The NAND bus 4 is a bus that complies with interface standards such as Toggle IF. That is, the controller 3 transmits and receives signals between the host device 6 and the NAND memory 2 according to each interface standard.

The controller 3 includes a host interface circuit (host I/F) 11, a built-in memory (RAM) 12, a processor (CPU) 13, a buffer memory 14, a NAND interface circuit (NAND I/F) 15, and an error checking and correcting (ECC) circuit 16.

The host interface circuit 11 is connected to the host device 6 via the host bus 5, and transfers instructions and data received from the host device 6 to the CPU 13 and the buffer memory 14. The host interface circuit 11 transfers the data in the buffer memory 14 to the host device 6 in response to the instruction of the CPU 13.

The CPU 13 controls an operation of the controller 3. For example, when a write instruction is received from the host device 6, the CPU 13 issues a write instruction to the NAND interface circuit 15 in response to the write instruction. At the time of reading and erasing, the CPU 13 issues a read instruction and an erase instruction to the NAND interface circuit 15 in response to a reading instruction and an erasing instruction. The CPU 13 executes various kinds of processing for managing the NAND memory 2. These various kinds of processing include garbage collection, refreshing, and wear leveling. The operation of the controller 3 to be described below may be realized by the CPU 13 executing firmware, or may be realized by hardware.

The NAND interface circuit 15 is connected to the NAND memory 2 via the NAND bus 4 and controls communication with the NAND memory 2. The NAND interface circuit 15 transmits various signals to the NAND memory 2 and receives signals from the NAND memory 2 based on the instruction received from the CPU 13. The buffer memory 14 temporarily stores write data and read data.

The RAM 12 is a semiconductor memory such as DRAM or SRAM, and is used as a work area of the CPU 13. The RAM 12 stores the firmware executed by the CPU 13 and various management tables for managing the NAND memory 2.

The ECC circuit 16 performs error detection and error correction processing on the data to be stored or on data stored in the NAND memory 2. The ECC circuit 16 has an encoder 16a and a decoder 16b. The encoder 16a generates an error correction code as the data is written, and adds the error correction code to the write data. The decoder 16b corrects an error bit included in the data read from the NAND memory 2 by the error correction code.

The error correction code generated by the encoder 16a includes codes for performing error correction using data in a page (hereinafter, referred to as in-page codes) and codes for performing error correction between a plurality of pages using data in the pages (hereinafter, inter-page codes). The in-page codes are, for example, Bose Chaudhurl Hocquenghem (BCH) codes or low density parity check (LDPC) codes. The inter-page codes are, for example, Reed Solomon (RS) codes or codes obtained by an EX-OR operation. Hereinafter, the inter-page codes are collectively referred to as a parity.

The encoder 16a functions as a first parity generation unit, a second parity generation unit, and a third parity generation unit as will be described later. The first parity generation unit generates a first parity P1 based on all page groups connected to a word line in a super block to be described later. The second parity generation unit generates a second parity P2 based on all page groups connected to all word lines in a media block to be described later. The third parity generation unit generates a third parity P3 for each word line based on each of page groups connected to each of a plurality of word lines in the media block.

Next, a configuration of the NAND memory 2 will be described. As illustrated in FIG. 1, the NAND memory 2 includes a memory cell array 21, a row decoder 22, a driver circuit 23, a column control circuit 24, a register group 25, and a sequencer 26.

The memory cell array 21 includes a plurality of blocks including a plurality of non-volatile memory cells associated with rows and columns. A configuration in the memory cell array 21 will be described in detail later. Reading and writing data to and from the memory cell array 21 is controlled by the controller 3.

The row decoder 22 selects one of blocks BLK0 to BLK3, and further selects a row direction in the selected block BLK. The driver circuit 23 supplies a voltage to the selected block BLK via the row decoder 22.

At the time of reading data, the column control circuit 24 senses data read from the memory cell array 21 and performs a necessary operation. The data on which the necessary operation is performed is output to the controller 3. At the time of writing data, the column control circuit 24 transfers a signal corresponding to write data received from the controller 3 to the memory cell array 21.

The register group 25 has an address register, a command register, and the like for storing various kinds of information. The address register stores an address received from the controller 3. The command register stores a command received from the controller 3.

The sequencer 26 controls operations of the NAND memory 2 based on various information stored in the register group 25.

Next, a specific configuration of the memory cell array 21 will be described. Data is written into and read from the memory cell array 21 in units of page. A size of the page is, for example, 16 kilobytes (131072 bits). The size of the page is not limited to this example and may be any size. Since the data cannot be overwritten into the NAND memory 2, the data needs to be erased in advance in order to write data. The data is erased on a block basis including a plurality of pages. In the present embodiment, a plurality of pages connected to a plurality of word lines is referred to as a physical block.

Figure 2:
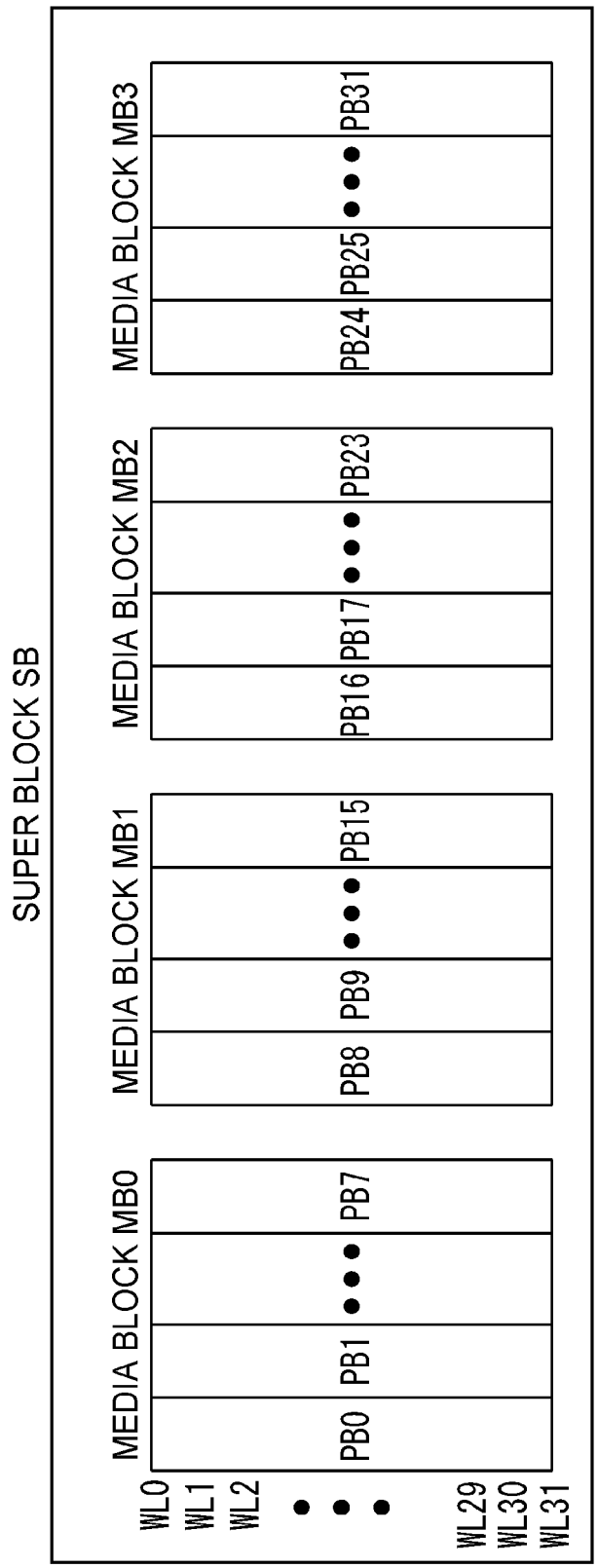
FIG. 2 is a diagram illustrating an example of a specific configuration of a memory cell array.

FIG. 2 is a diagram illustrating a physical block in the memory cell array 21. In the example of FIG. 2, a plurality of pages (page groups) to which 32 word lines WL0 to WL31 are connected is regarded as one physical block PB. The number of word lines WL included in one physical block PB is not limited to 32.

As illustrated in FIG. 2, in the present embodiment, one media block (first block group) MB is constituted by eight physical blocks PB. One super block (second block group) SB is constituted by four media blocks MB0 to MB3. Details of the super block SB and the media block MB will be described later. In FIG. 2, an example in which the media block MB0 includes physical blocks PB0 to PB7, the media block MB1 includes physical blocks PB8 to PB15, the media block MB2 includes physical blocks PB16 to PB23, and the media block MB3 includes physical blocks PB24 to PB31 is illustrated.

Figure 3:
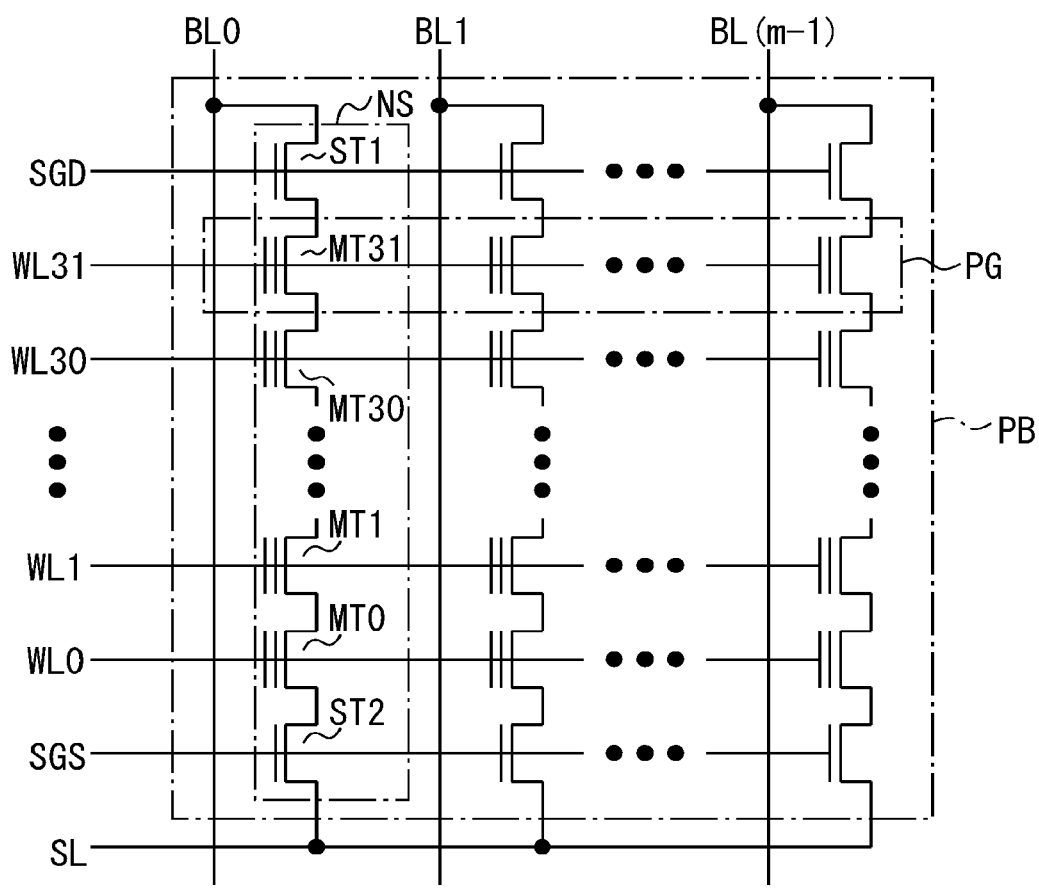
FIG. 3 is a circuit diagram illustrating an example of a circuit configuration of one physical block.

FIG. 3 is a circuit diagram illustrating an example of a specific configuration of one physical block PB. FIG. 3 illustrates a circuit configuration of the physical block PB to which 32 word lines WL0 to WL31 are connected. In FIG. 3, a page PG is constituted by a plurality of memory cells connected to one word line WL and a plurality of bit lines BL, and a physical block PB is constituted by a plurality of pages PG connected to a plurality of word lines WL0 to WL31.

As illustrated in FIG. 3, for example, m (m is, for example, 16k) NAND strings NS in which a plurality of memory cells is connected in a cascade connection is arranged in a direction in which the word lines WL0 to WL31 extend (hereinafter, a word line direction). A select transistor ST1 is connected to one end side of each NAND string NS, and a select transistor ST2 is connected to the other end side. The corresponding bit line BL [0: m−1] is connected to a drain of each select transistor ST1. A gate signal SGD input to a gate of the select transistor ST1 turns on or off all the select transistors ST1 arranged in the word line direction. A gate signal SGS input to a gate of the select transistor ST2 turns on or off all the select transistors ST2 arranged in the word line direction.

In the present embodiment, the data is not erased for single physical block PB, but the data is erased for each of the media blocks MB0 to MB3 including the plurality of physical blocks PB. The media block is also referred to as a logical block.

In the example of FIG. 2, one logical block (media block MB) is constituted by eight physical blocks PB.

Figure 4:
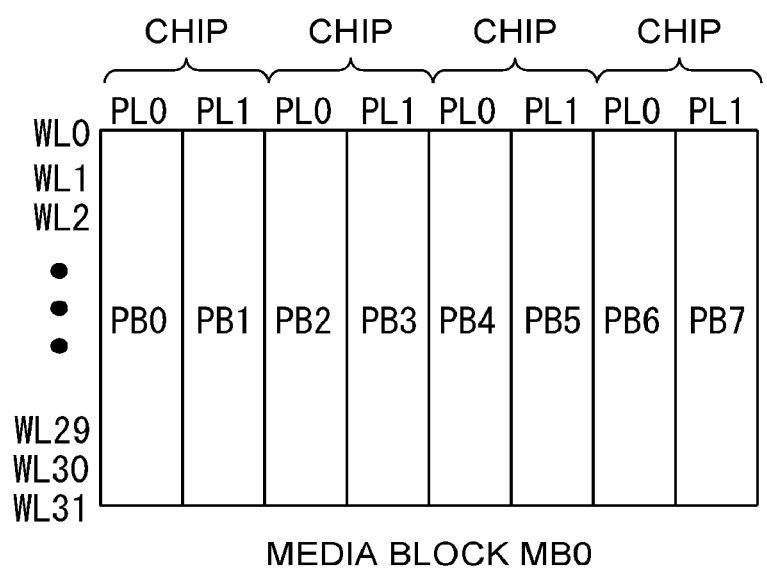
FIG. 4 is a diagram illustrating an example of a chip configuration constituting a media block.

One media block MB has eight physical blocks PB as illustrated in FIG. 2, but can be constituted by a plurality of physical blocks PB each belonging to a plurality of chips. FIG. 4 is a diagram illustrating an example of a relationship between the physical blocks PB0 to PB7 in the media block MB0 and the chips. As illustrated in FIG. 4, one media block MB0 can be formed over a span of, for example, four chips. A plurality of planes PL that can be collectively accessed by the controller 3 can be provided at each chip. In the example of FIG. 4, one physical block PB belonging to a plane PL0 and one physical block PB belonging to a plane PL1 provided on each of the four chips are included in one media block MB. Accordingly, the controller 3 can collectively access the two physical blocks PB in each chip. The controller 3 can access a plurality of chips in parallel via a plurality of channels. The plurality of physical blocks PB is connected to each channel. The media block MB includes physical blocks PB of the number of which corresponds to a particular number of channels and which are connected to any one channel of the plurality of channels. Accordingly, the controller 3 can access the media block MB including the plurality of chips connected via each of the plurality of channels.

In the present embodiment, as illustrated in FIG. 2, a virtual media block MB (hereinafter, referred to as a super block SB) is constituted by the plurality of media blocks MB0 to MB3. The reason for providing the super block SB is to reduce a ratio of parities to user data while maintaining a parity configuration that can handle a block failure. Thus, the parity (first parity P1) is provided for each super block SB. The first parity is a parity for correcting an error occurring in the super block SB by data in each of the media blocks MB in the super block SB.

More specifically, the parity (first parity P1) for two pages is provided for each super block SB, and thus, two erasure corrections can be performed.

Incidentally, when the parity (first parity P1) for the error correction between the media blocks MB is provided for each super block SB, the following problems may occur. When garbage collection is performed for a certain super block SB, a storage area (memory area) of the NAND memory 2 in a free state with a maximum size of the super block SB is prepared in advance, and at least all valid data in the super block SB are copied to the memory area. When the data to be copied includes an error, the error can be corrected by using the parity (first parity P1). After it is confirmed that the copy has succeeded, the super block SB as a target for the garbage collection is released. That is, when there is not enough free memory area, since the garbage collection cannot be performed, it is necessary to prepare the free memory area with the maximum size of the super block SB in advance. In order to solve this problem, in the present embodiment, a parity (second parity P2) is provided for each media block MB constituting the super block SB. The second parity P1 is a parity for correcting an error occurring in a certain media block MB by the data in the certain media block MB.

Figure 5:
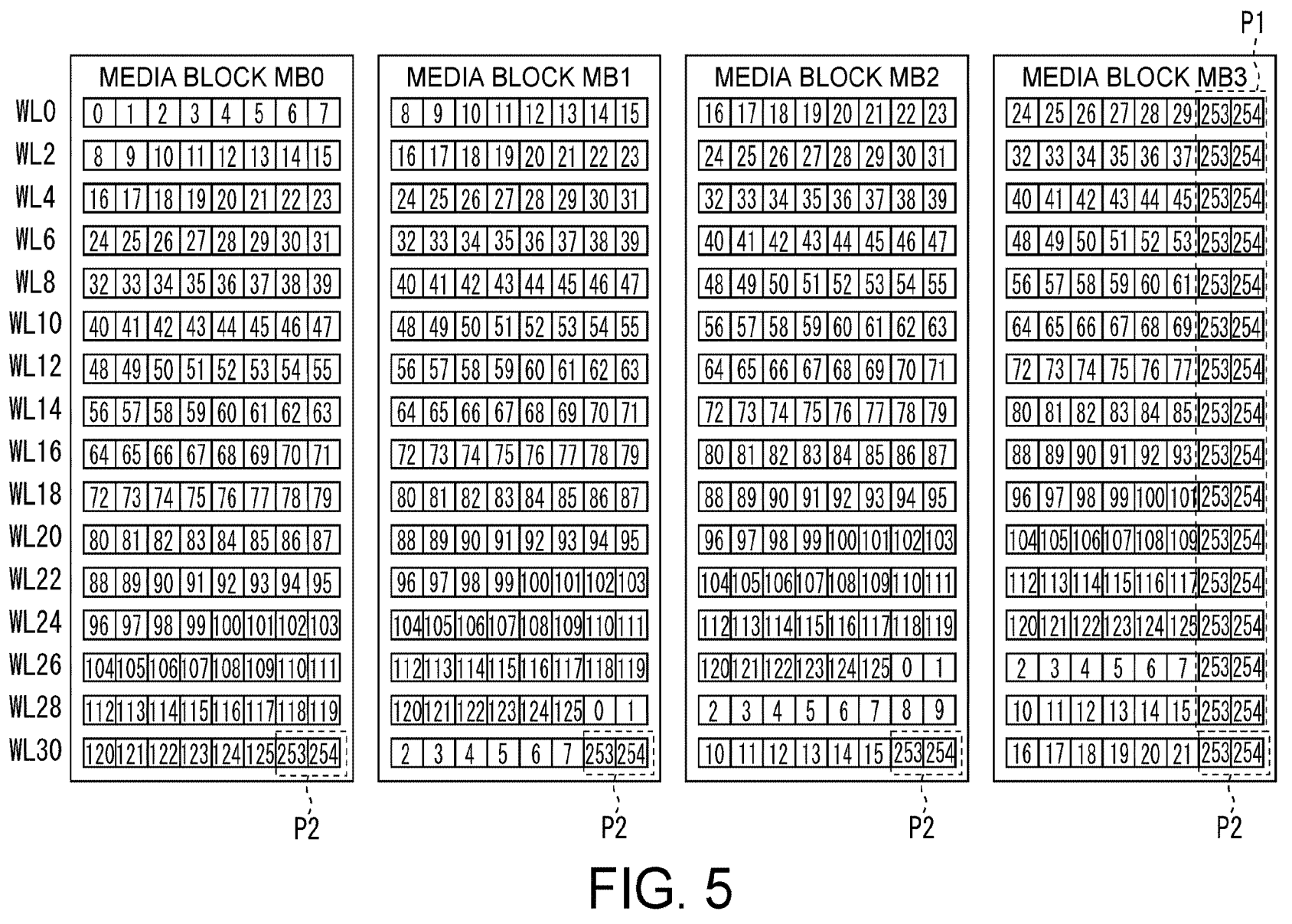

FIG. 5 is a diagram illustrating arrangement locations of the parities in the super block SB according to the present embodiment. FIG. 5 illustrates an example in which each media block MB in the super block SB is divided into even-numbered word lines WL and odd-numbered word lines WL, the parity is generated for each page group (also referred to as an RS frame) connected to each even-numbered word line WL, and the parity is generated in the RS frame connected to each odd-numbered word line WL. As stated above, the reason why the parities are generated separately for the even-numbered word lines WL and the odd-numbered word lines WL is to prevent a short circuit of the adjacent word line WL which is a defective mode of the NAND memory. The RS frames separately are prepared for the even-numbered word lines and the odd-numbered word lines, and the parity is generated for each RS frame. Thus, a short-circuit defect of the adjacent word line WL can be detected and remedied.

A modified example in which parities are generated for all the word lines WL in the super block SB without dividing the media block into the even-numbered word lines WL and the odd-numbered word lines WL is also considered, but an example in which the parities are generated separately for the even-numbered word lines WL and the odd-numbered word lines WL will be described below.

FIG. 5 illustrates 16 RS frames connected to 16 even-numbered word lines WL0 to WL30 for each media block MB in the super block SB constituted by four media blocks MB. However, in reality, as mentioned above, there are 16 different RS frames connected to 16 odd-numbered word lines WL1 to WL31. Since the parity arrangement in the RS frame for the odd-numbered word line WL is the same as that in FIG. 5, the parity arrangement in the RS frame for the even-numbered word line WL will be mainly described below.

FIG. 5 illustrates an example in which eight pages are connected to each word line WL in each media block MB. In each media block MB, a page group including eight pages connected to each word line WL is provided for each word line WL, and the total number of page groups per media block MB is 16. Thus, there are 33 16=128 pages in the RS frame included in each media block MB. Two of these pages are areas in the media block MB that store the parity (second parity P2) for the error correction between the pages. A specific example of this parity is a Reed Solomon code. The Reed Solomon codes for two pages are provided, and thus, the error correction for up to two pages can be performed. Here, the number of word lines WL of each media block MB may be 33 or more. For example, when the number of word lines WL in one media block MB is 64, one media block MB includes 64 RS frames constituted by two sets of 16 even-numbered word lines WL and 16 odd-numbered word lines WL and 8 pages connected to each word line WL.

As the parities (first parity P1 and second parity P2) according to the present embodiment, an error correction code other than the Reed Solomon code may be used. For example, an operation value of the exclusive OR (EX-OR) of bit strings of each page in the media block MB may be used as the parity.

The parities for two pages provided in each media block MB of FIG. 5 (second parity P2) depends on the data of the pages in each media block MB, and do not depend on the data of the pages in other media blocks MB. Thus, according to the present embodiment, the data can be erased for each media block MB. When the garbage collection is performed, the data can be copied or moved for each media block MB. Accordingly, the free area of the NAND memory 2 required for the garbage collection can be reduced, and the memory area in the SSD can be effectively used for the user data.

The controller 3 identifies 128 pages included in each media block MB in the super block SB of FIG. 5 by different page index numbers. In the example of FIG. 5, the pages connected to the word lines WL0 to WL30 are assigned page index numbers 0 to 125. The last two pages of the eight pages connected to the word line WL30 are used as areas for storing the parities (second parities P2). These pages are assigned page index numbers 253 and 254.

In addition, the pages in the media blocks MB0 to MB3 connected to the same word line WL are assigned continuous page index numbers. For example, the pages in the media blocks MB0 to MB3 connected to the word line WL0 are assigned continuous page index numbers 0 to 29. The last two pages of the eight pages connected to each word line WL in the media block MB3 are used as an area for storing the parity (first parity P1). These pages are assigned page index numbers 253 and 254.

In the media block MB3, the last two pages connected to each word line WL are used as an area for storing the parity (first parity P1). Thus, the number of areas for storing user data is smaller than that in the other media blocks MB0 to MB2. In the media block MB3, page index numbers 30 and 31 are omitted. That is, the page index numbers of the areas for storing the parity (first parity P1) for the plurality of pages connected to each word line WL are 253 and 254.

The parity (first parity P1) in the super block SB may be stored in a block different from the media blocks MB0 to MB3. In this case, while the user data that can be stored in the media block MB3 can be increased, the number of times the data is written increases once. Thus, a time required for writing the data becomes long.

Figure 6:
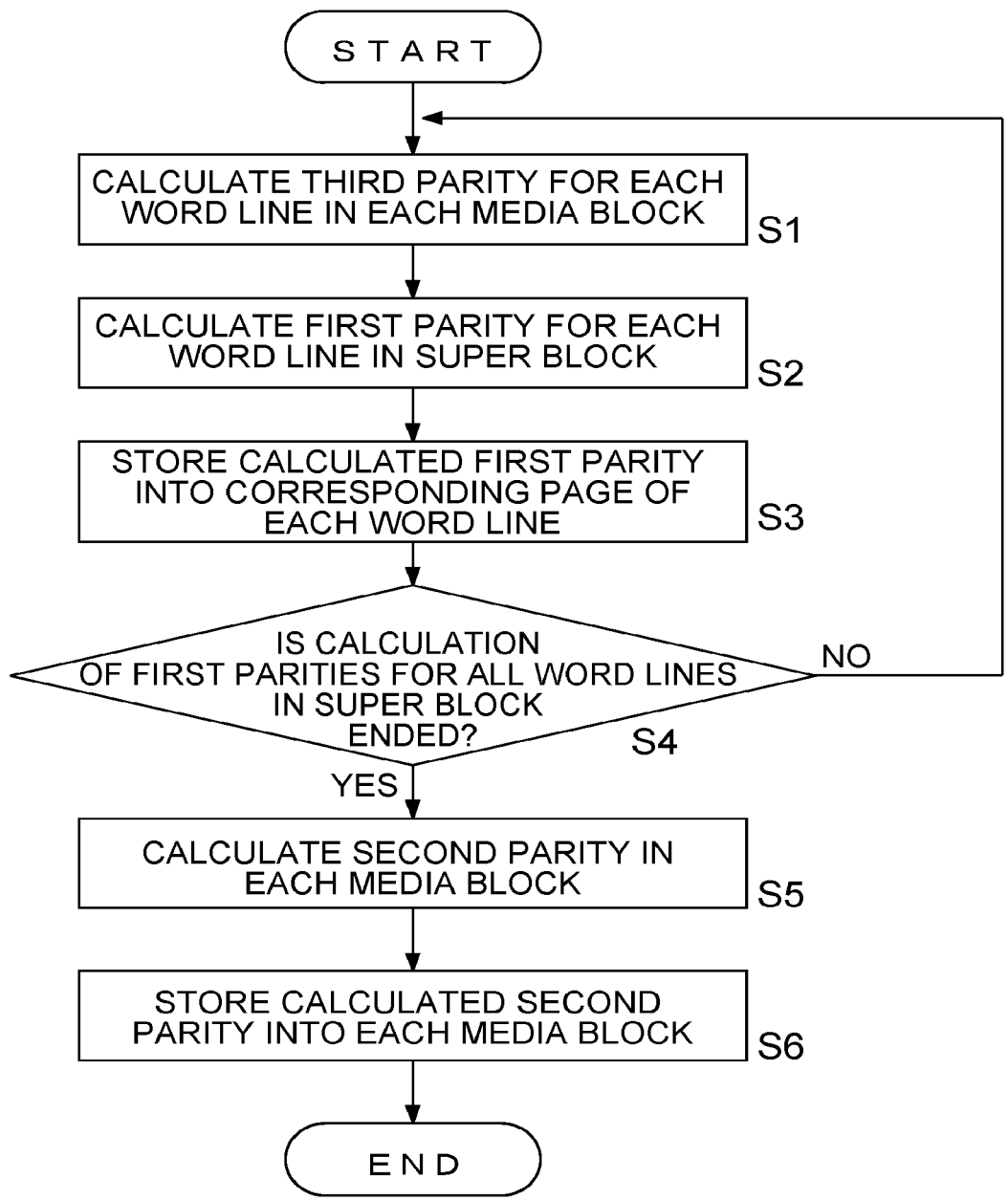
FIG. 6 is a flowchart illustrating an example of a parity generation procedure in the super block.

FIG. 6 is a flowchart illustrating an example of a parity generation procedure in the super block SB. This flowchart illustrates a processing procedure performed by the controller 3 when the host device 6 sends a data write instruction for the NAND memory 2 to the controller 3. When a data write request is received from the host device 6, the controller 3 uses a partial memory area in the NAND memory 2 as an input buffer. The controller 3 stores the data of the super block SB illustrated in FIG. 5 in this input buffer.

Figure 7:
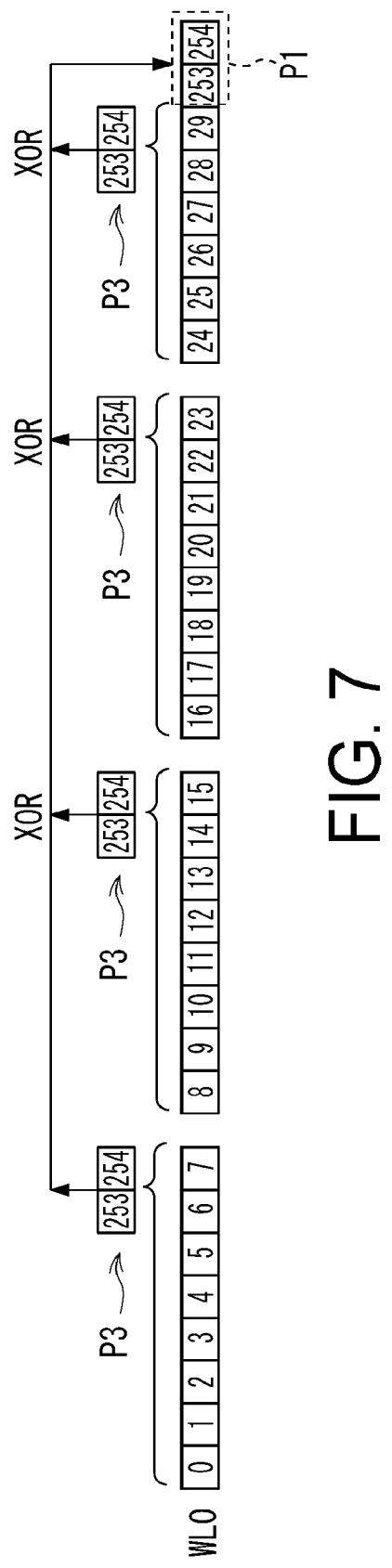
FIG. 7 is a diagram for explaining a processing operation of calculation of a third parity.

First, the controller 3 calculates the parity (third parity P3) in each word line direction for each word line WL in each of the media block MB0 to MB3 (S1). FIG. 7 is a diagram for describing a processing operation of the calculation of the third parity P3. For example, eight pages are arranged in each word line WL direction in each media block MB. In (S1) of FIG. 6, the controller 3 calculates the parities (third parities P3) by using the data for these 8 pages or 6 pages out of 8 pages for each word line WL in each of the media blocks MB0 to MB3. The calculated plurality of parities (third parities P3) is stored in, for example, the RAM 12 in the controller 3.

Subsequently, the controller 3 calculates the parity (first parity P1) for each word line WL in the super block SB by the exclusive OR operation of the plurality of calculated parities (third parities P3) (S2). The controller 3 stores the calculated parity (first parity P1) into the last two pages which are the corresponding pages of each word line WL arranged in the media block MB3 (S3).

Subsequently, the controller 3 determines whether or not the calculation of the parities (first parities P1) for all the word lines WL as targets in the super block SB is ended (S4). The processes of (S1) to (S4) are repeated until all the parities (first parities P1) are calculated (S4: NO).

When the calculation of all the parities (first parities P1) is completed (S4: YES), the controller 3 calculates the parity (second parity P2) of each media block MB (S5). The controller 3 stores the calculated parities (second parities P2) into the corresponding pages of each media block MB (S6).

Figure 8:
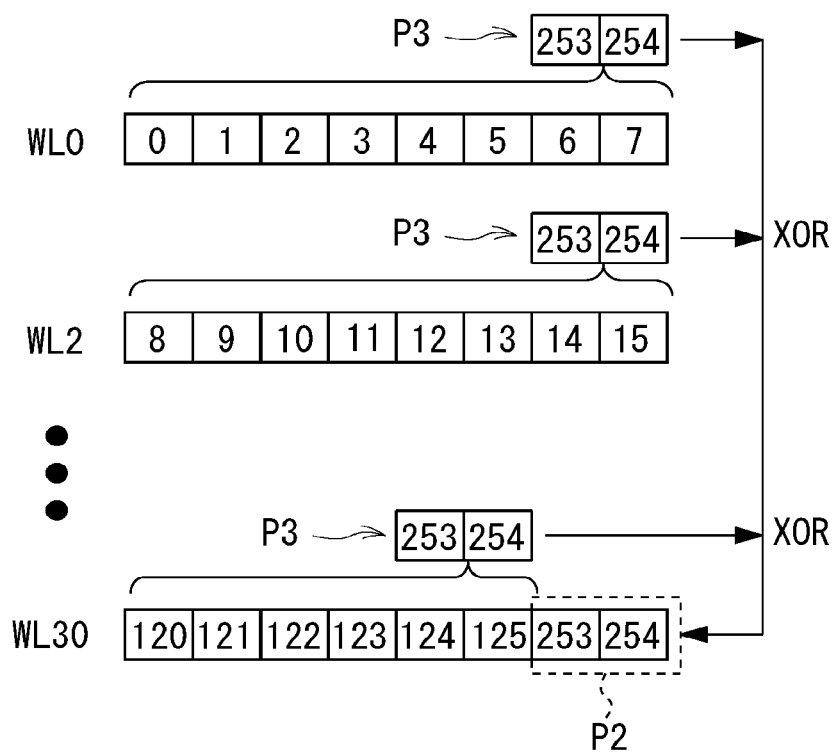
FIG. 8 is a diagram for explaining a processing operation of calculation of a second parity.

FIG. 8 is a diagram for describing a processing operation of the calculation of the second parity P2. In (S1) of FIG. 6 described above, the parity (third parity P3) is calculated for each word line WL in each media block MB and stored in, for example, the RAM 12. In (S6), a value obtained by performing the exclusive OR operation of these parities (third parities P3) is stored as the parity (second parity P2) in the last two pages of the word line WL30 which are the corresponding pages in each media block MB. In (S5) described above, the second parity P2 is calculated after the calculation of the first parities P1 of all the word lines WL in the super block SB is ended. However, whenever the first parity P1 of each word line WL in the super block SB is calculated in (S2), the calculation process of the second parity P2 may be performed in parallel with the calculation process of the first parity P1 by performing the exclusive OR operation of the third parities P3 of each word line WL in each media block MB. Accordingly, it is not necessary to store the third parities P3 for all the word lines WL in the RAM 12 for a longer time than necessary, and the amount of the RAM 12 used can be saved.

FIG. 5 illustrates the arrangement of the first and second parities P1 and P2 in the four media blocks MB connected to the 16 even-numbered word lines WL0 to WL30, but there are the RS frames connected to the 16 odd-numbered word lines WL1 to WL31 in each media block MB although omitted in FIG. 5. The RS frames connected to the 16 odd-numbered word lines WL1 to WL31 are formed in the same manner as in FIG. 5, and the first, second, and third parities P1, P2, and P3 are calculated in the same manner as in FIG. 6, and the first parities P1 and the second parities P2 are stored in the media blocks MB0 to MB3 in the same manner as in FIG. 5.

Of the first and second parities P1 and P2 illustrated in FIG. 5, the parity (second parity P2) for two pages connected to the word line WL30 in each media block MB is used for performing the error correction between the pages in each media block MB, and is a value that is not affected by the other media blocks MB. Thus, in the present embodiment, the data erasure and the data movement for the garbage collection can be performed for each media block MB.

As illustrated in FIG. 5, the controller 3 manages the media block MB by dividing the media block into a media block MB for an even-numbered word line WL connected to a plurality of even-numbered word lines WL and a media block MB for an odd-numbered word line WL connected to a plurality of odd-numbered word lines WL. The controller 3 manages the super block SB by dividing the super block into a super block SB for an even-numbered word line WL including a plurality of media blocks MB for an even-numbered word line WL, and a super block SB for an odd-numbered word line WL including a plurality of media blocks MB for an odd-numbered word line WL. The controller 3 generates a first parity P1 for correcting an error occurring in the super block SB for an even-numbered word line WL by data in each of the media blocks MB for an even-numbered word line WL in the super block SB for an even-numbered word line WL, and a second parity P2 for correcting an error occurring in the media block MB for an even-numbered word line WL by data in the media block MB for an even-numbered word line WL. Similarly, the controller 3 generates a first parity P1 for correcting an error occurring in the super block SB for an odd-numbered word line WL by data between the media blocks MB for an odd-numbered word line WL in the super block SB for an odd-numbered word line WL, and a second parity P2 for correcting an error occurring in the media block MB for an odd-numbered word line WL by data in the media block MB for an odd-numbered word line WL. Accordingly, the short-circuit defect of the adjacent word line WL can be detected and remedied.

Although it has been described in the above-described embodiment that the NAND memory 2 is provided in the memory system 1, the present embodiment can also be applied to a memory system 1 having a non-volatile memory other than the NAND memory 2. Specifically, the present embodiment can be applied to any non-volatile memory as long as the non-volatile memory reads and writes for each unit corresponding to the page and erases for each unit corresponding to the block having a data size larger than that of the page.

As described above, in the present embodiment, the parities (second parities P2) that do not depend on the other media blocks MB are provided in each media block MB in addition to the plurality of parities (first parities P1) provided for each super block SB including the plurality of media blocks MB0 to MB3. Thus, the data erasure and the data movement for the garbage collection can be performed for each media block MB.

Other aspects of the present embodiment can be considered as follows.

The controller 3 may include a third parity generation unit that generates a third parity for each word line within the first block group based on the page group connected to each of the plurality of word lines in the first block group, and the second parity generation unit may generate the second parity based on a plurality of the third parities corresponding to the plurality of page groups connected to all the word lines in the first block group.

The first parity generation unit may generate a plurality of the first parities by values obtained by performing an exclusive OR operation of the plurality of third parities for all the page groups connected to the plurality of word lines in the second block group, and the second parity generation unit may generate the second parities by values obtained by performing the exclusive OR operation of the plurality of third parities for all the page groups connected to all the word lines in the first block group.

The controller 3 may identify all the pages in the first block group by different page index numbers.

The controller 3 may identify all the pages connected to any one word line in the second block group by different page index numbers.

The first parity and the second parity may include a Reed Solomon code.

The first parity and the second parity may be values obtained by performing an exclusive OR operation of a plurality of pages as correction targets.

The non-volatile memory may include a NAND flash memory.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A memory system comprising:
a non-volatile memory having a plurality of memory cells; and
a controller configured to control writing, reading, and erasing of data to and from the non-volatile memory,
wherein the non-volatile memory includes
a page for which the data is written into and read from at least a part of the plurality of memory cells, and
a block having a plurality of the pages,
the controller is configured to
manage a first block group including a plurality of the blocks and a second block group including a plurality of the first block groups, and
generate a first parity and a second parity, the first parity being a parity for correcting an error occurring in the second block group by data in each of the plurality of first block groups in the second block group, and the second parity being a parity for correcting an error occurring in the first block group by data in the first block group.

2. The memory system according to claim 1,
wherein the first parity is stored in the second block group, and
the second parity is stored in the first block group.

3. The memory system according to claim 1, further comprising:
a plurality of word lines connected to the first block group,
wherein the first block group has a plurality of page groups each having a plurality of pages connected to each of the plurality of word lines, and
the controller includes
a first parity generator configured to generate the first parity based on all the page groups connected to any one word line in the second block group, and
a second parity generator configured to generate the second parity based on all the page groups connected to all the word lines in the first block group.

4. The memory system according to claim 3,
wherein the first parity generator is configured to generate a plurality of the first parities corresponding to each of the plurality of word lines in the second block group in association with all the page groups connected to each of the plurality of word lines in the second block group, and
the second parity generator is configured to generate the second parity for each of the plurality of first block groups.

5. The memory system according to claim 3,
wherein the controller further includes a third parity generator configured to generate a third parity for each word line within the first block group based on the page group connected to each of the plurality of word lines in the first block group, and
the second parity generator is configured to generate the second parity based on a plurality of the third parities corresponding to the plurality of page groups connected to all the word lines in the first block group.

6. The memory system according to claim 5,
wherein the first parity generator is configured to generate a plurality of the first parities by values obtained by performing an exclusive OR operation of the plurality of third parities for all the page groups connected to each of the plurality of word lines in the second block group, and
the second parity generator is configured to generate the second parities by values obtained by performing the exclusive OR operation of the plurality of third parities for all the page groups connected to each of all the word lines in the first block group.

7. The memory system according to claim 1,
wherein the controller is further configured to
manage the first block group by dividing the first block group into a first block group for an even-numbered word line connected to a plurality of even-numbered word lines and a first block group for an odd-numbered word line connected to a plurality of odd-numbered word lines, manage the second block group by dividing the second block group into a second block group for an even-numbered word line including a plurality of the first block groups for the even-numbered word line, and a second block group for an odd-numbered word line including a plurality of the first block groups for the odd-numbered word line, generate a first parity for an even-numbered word line for correcting an error occurring in the second block group for the even-numbered word line by data in each of the first block groups for the even-numbered word line in the second block group for the even-numbered word line, and a second parity for an even-numbered word line for correcting an error occurring in the first block group for the even-numbered word line by data in each of the first block group for the even-numbered word line, and generate a first parity for an odd-numbered word line for correcting an error occurring in the second block group for an odd-numbered word line by data in each of the first block groups for the odd-numbered word line in the second block group for the odd-numbered word line, and a second parity for an odd-numbered word line for correcting an error occurring in the first block group for the odd-numbered word line by data in each of the first block group for the odd-numbered word line.

8. The memory system according to claim 1, wherein the controller is further configured to
perform data erasure and data movement for garbage collection for each first block group.

9. The memory system according to claim 1,
wherein the controller is further configured to
identify all the pages in the first block group by different page index numbers, and
identify all the pages connected to a word line in the second block group by different page index numbers.

10. The memory system according to claim 1,
wherein the controller includes a plurality of channels accessible in parallel, and
the first block group includes a plurality of blocks connected to any one channel of the plurality of channels.

11. The memory system according to claim 1,
wherein the first parity and the second parity include a Reed Solomon code.

12. The memory system according to claim 1,
wherein the first parity and the second parity are values obtained by performing an exclusive OR operation of data of a plurality of pages as correction targets.

13. The memory system according to claim 1,
wherein the non-volatile memory includes a NAND flash memory.

14. A control method of a memory system that comprises a non-volatile semiconductor memory including a plurality of blocks, each block having a plurality of pages for which data is written into and read from, the control method comprising:
managing a first block group including a plurality of the blocks;
managing a second block group including a plurality of the first block groups,
generating a first parity that is a parity for correcting an error occurring in the second block group by data in each of the plurality of first block groups in the second block group; and generating a second parity that is a parity for correcting an error occurring in the first block group by data in the first block group.

15. The control method according to claim 14,
wherein the first parity is stored in the second block group, and
the second parity is stored in the first block group.

16. The control method according to claim 14,
wherein the non-volatile semiconductor memory further includes a plurality of word lines connected to the first block group, and wherein
the first block group has a plurality of page groups each having a plurality of pages connected to each of the plurality of word lines,
the method further comprising:
generating the first parity based on all the page groups connected to any one word line in the second block group, and
generating the second parity based on all the page groups connected to all the word lines in the first block group.

17. The control method according to claim 16, further comprising:
generating a plurality of the first parities corresponding to each of the plurality of word lines in the second block group in association with all the page groups connected to each of the plurality of word lines in the second block group, and
generating the second parity for each of the plurality of first block groups.

18. The control method according to claim 14, further comprising:
managing the first block group by dividing the first block group into a first block group for an even-numbered word line connected to a plurality of even-numbered word lines and a first block group for an odd-numbered word line connected to a plurality of odd-numbered word lines,
managing the second block group by dividing the second block group into a second block group for an even-numbered word line including a plurality of the first block groups for an even-numbered word line, and a second block group for an odd-numbered word line including a plurality of the first block groups for an odd-numbered word line,
generating a first parity for an even-numbered word line that corrects an error occurring in the second block group for an even-numbered word line by data between the first block groups for an even-numbered word line in the second block group for an even-numbered word line, and a second parity for an even-numbered word line that corrects an error occurring in the first block group for an even-numbered word line by data in the first block group for an even-numbered word line, and
generating a first parity for an odd-numbered word line that corrects an error occurring in the second block group for an odd-numbered word line by data between the first block groups for an odd-numbered word line in the second block group for an odd-numbered word line, and a second parity for an odd-numbered word line that corrects an error occurring in the first block group for an odd-numbered word line by data in the first block group for an odd-numbered word line.

19. The control method according to claim 14, further comprising:
performing data erasure and data movement for garbage collection for each first block group.

20. The control method according to claim 14, further comprising:
    accessing a plurality of the semiconductor memories in parallel via a plurality of channels, and wherein
    the first block group includes a plurality of blocks connected to any one channel of the plurality of channels.

\* \* \* \* \*